(12) United States Patent
Smith et al.

(10) Patent No.: US 9,096,426 B2
(45) Date of Patent: Aug. 4, 2015

(54) ELECTRONIC DEVICE STRUCTURE AND METHOD OF MAKING ELECTRONIC DEVICES AND INTEGRATED CIRCUITS USING GRAYSCALE TECHNOLOGY AND MULTILAYER THIN-FILM COMPOSITES

(71) Applicant: U.S. Army Research Laboratory ATTN: RDRL-LOC-I, Adelphi, MD (US)

(72) Inventors: Gabriel I. Smith, Ellicott City, MD (US); Brendan Hanrahan, Liburn, GA (US); Christopher M Waits, Silver Spring, MD (US); Ronald G Polcawich, Derwood, MD (US); Luz Sanchez, Columbia, MD (US); Sarah Salah Bedair, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/857,343

(22) Filed: Apr. 5, 2013

(65) Prior Publication Data
US 2014/0299967 A1    Oct. 9, 2014

(51) Int. Cl.
*H01L 29/06*    (2006.01)
*B81C 1/00*    (2006.01)
*B81B 3/00*    (2006.01)

(52) U.S. Cl.
CPC ........... *B81C 1/00396* (2013.01); *B81B 3/0018* (2013.01); *B81C 1/00349* (2013.01)

(58) Field of Classification Search
CPC ............ B81C 1/00396; B81C 1/00349; B81C 3/0018

USPC .......................................................... 257/618
See application file for complete search history.

(56) References Cited

U.S. PATENT DOCUMENTS

| | | | |
|---|---|---|---|
| 5,310,623 A | 5/1994 | Gal | |
| 6,429,058 B1* | 8/2002 | Colgan et al. | 438/158 |
| 2006/0134922 A1* | 6/2006 | Taussig et al. | 438/739 |
| 2008/0061333 A1* | 3/2008 | Hidaka | 257/295 |
| 2009/0224249 A1* | 9/2009 | Miyairi et al. | 257/59 |

(Continued)

FOREIGN PATENT DOCUMENTS

JP    2003/015275    *    1/2003

OTHER PUBLICATIONS

Canyon Materials Inc., High Energy Beam Sensitive(HEBS) Glass, http://www.canyonmaterials.com/hebsglass.html.

(Continued)

*Primary Examiner* — A. Sefer
(74) *Attorney, Agent, or Firm* — Lawrence E. Anderson

(57) ABSTRACT

A physical structure and a method for forming a electronic devices on a substrate comprising: providing a substrate; forming a plurality of layers on the substrate, the layers comprising at least two layers of conducting material and a layer of insulating material therebetween; depositing photoresist material onto predetermined regions of the plurality of layers, the photoresist material varying in thickness; utilizing gray scale illumination on the photoresist material; removing a portion of the layers using physical etching to expose predetermined portions of the conducting layers. Optionally, the photoresist may be utilized on a plurality of discrete electronic devices concurrently, such that the gray scale illumination is conducted on a plurality of discrete electronic devices concurrently. Similarly, the physical etching may be conducted on the discrete electronic devices concurrently; removing different thicknesses of material concurrently. Also claimed is a product made by the claimed method.

18 Claims, 13 Drawing Sheets

Photoresist with stepped pattern – top view (above), cross sectional view (below)

(56) References Cited

U.S. PATENT DOCUMENTS

2009/0233389 A1* 9/2009 Miyairi et al. ................ 438/22
2011/0177666 A1* 7/2011 Nozawa ..................... 438/382

OTHER PUBLICATIONS

Waits, C. "Investigation of gray-scale technology for large area 3D silicon MEMS structures," J. Micromech. Microeng. 13 170-177 (2003).

Smith, G, et al. "PZT-Based Piezoelectric MEMS Technology," J. Am. Ceram. Soc. 95[6]1777-1 (2012) Believed to be available online Apr. 25, 2012.

M. Iqbal, et al., "Fabrication of Beam Steering Elements and Couplers with Grayscale Lithography Using HEBS Glass," Frontiers in Optics, OSA Technical Digest Series (Optical Society of America, 2005) paper JTuC24.

* cited by examiner

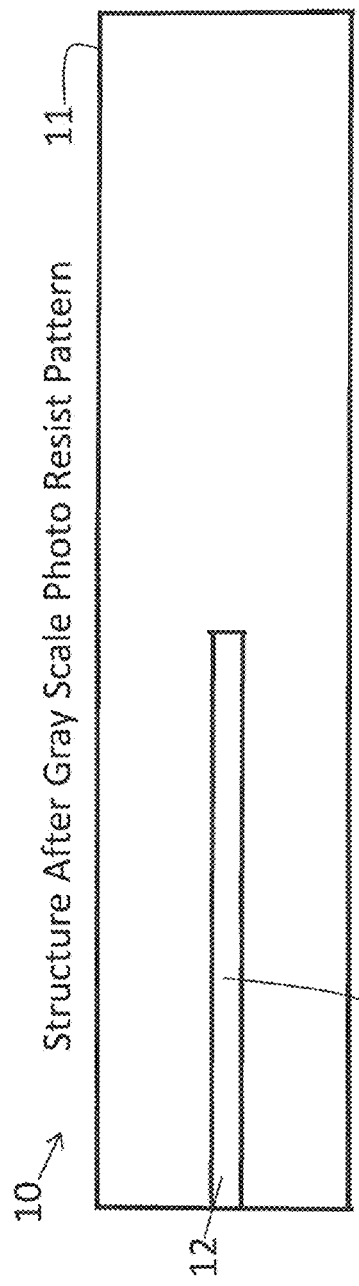
FIG. 1A – Photoresist ramp on multilayer stack – top view
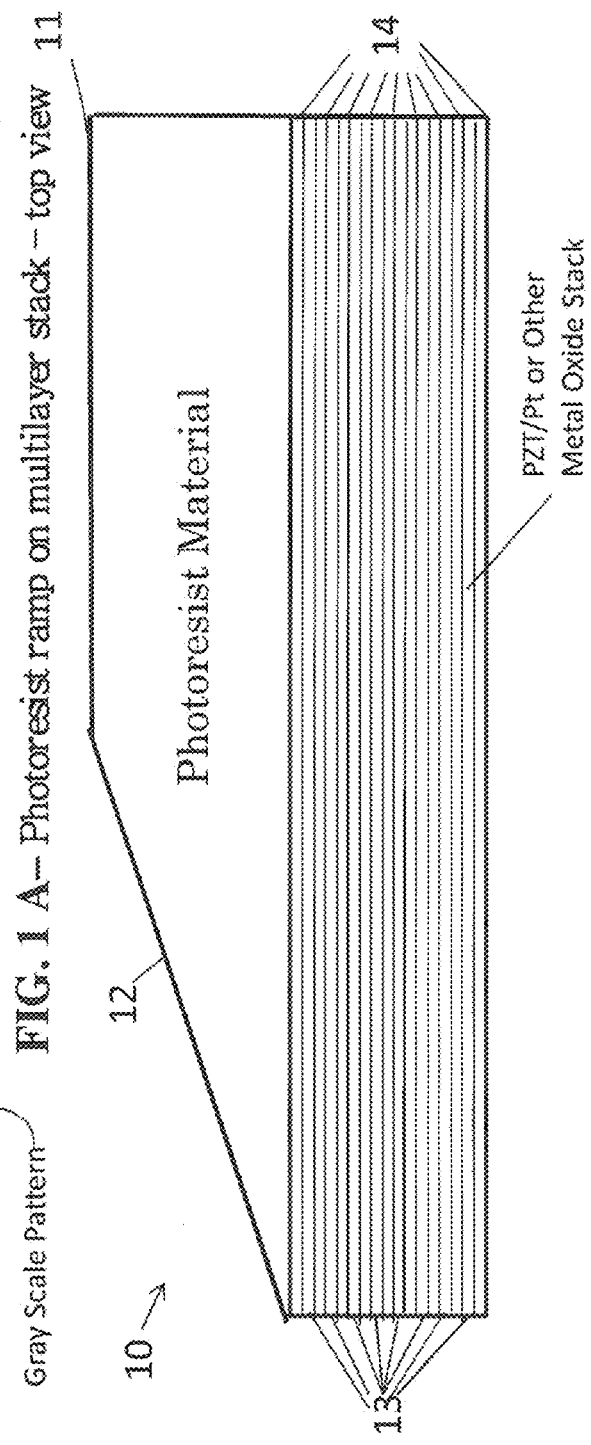
FIG. 1B – Photoresist ramp on multilayer stack – cross sectional view

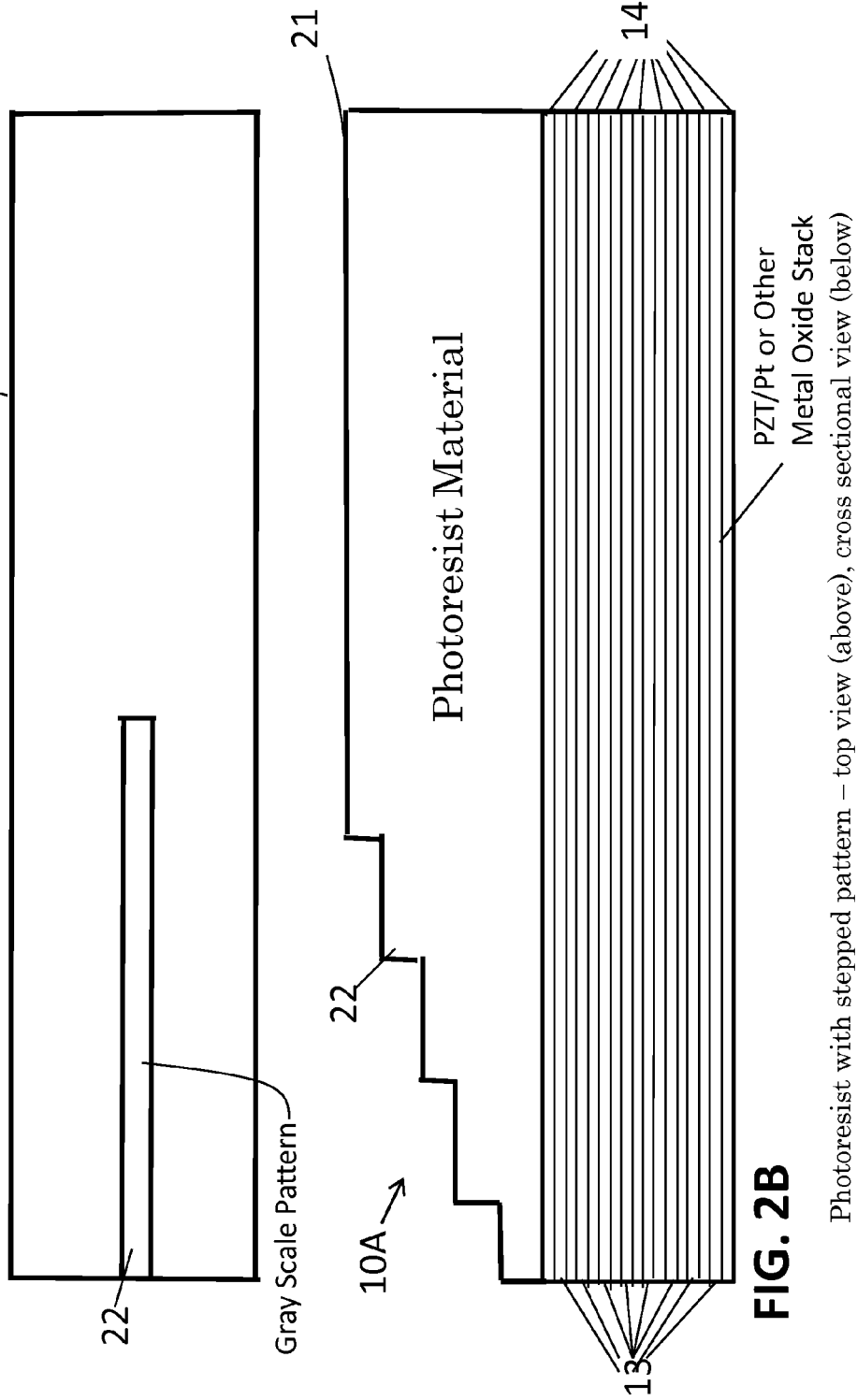
FIG. 2A Alternate Structure After Gray Scale Photoresist Pattern
FIG. 2B Photoresist with stepped pattern – top view (above), cross sectional view (below)

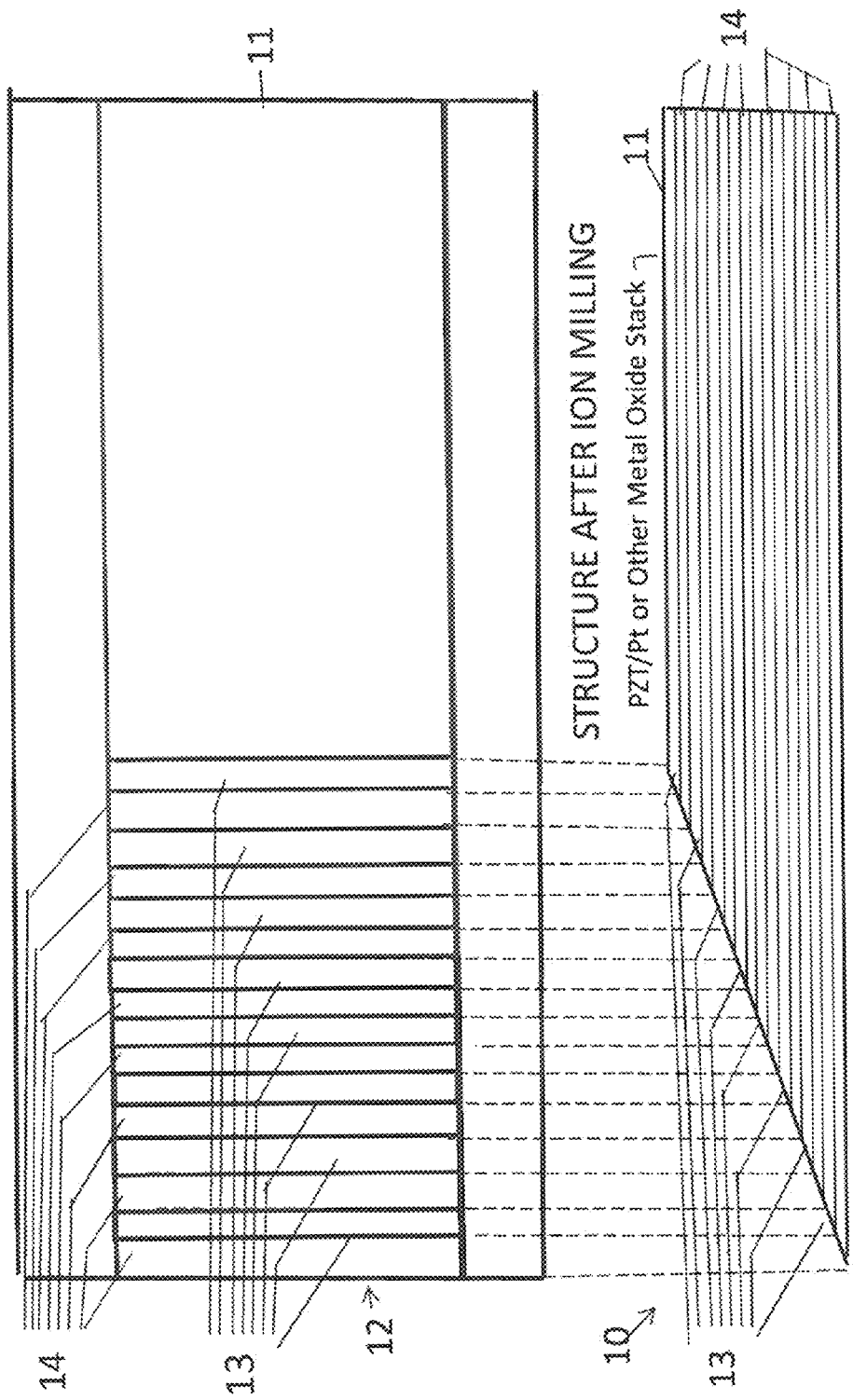
Figure 3 – Photo resist removed -- Ramped pattern "transferred" into multilayer stack -- top view (above), cross sectional view (below)

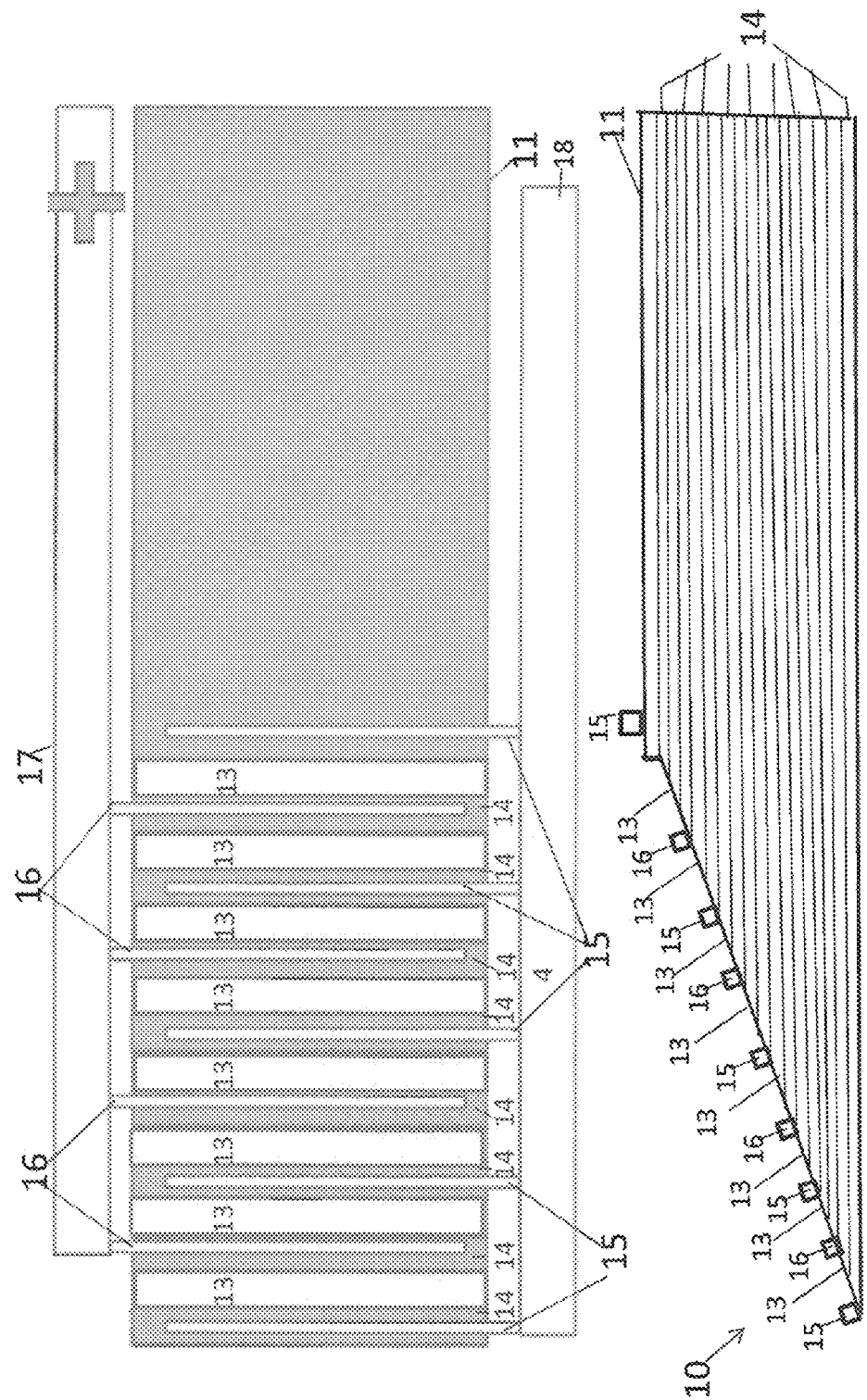
*Figure 4* – Top and side view of ramped pattern transferred into multilayered stack. Multilayer stack with interdigitated electrode pattern. This allows for alternating layers to be connected which is a common need in many capacitive devices. Top view (above); cross sectional view (below).

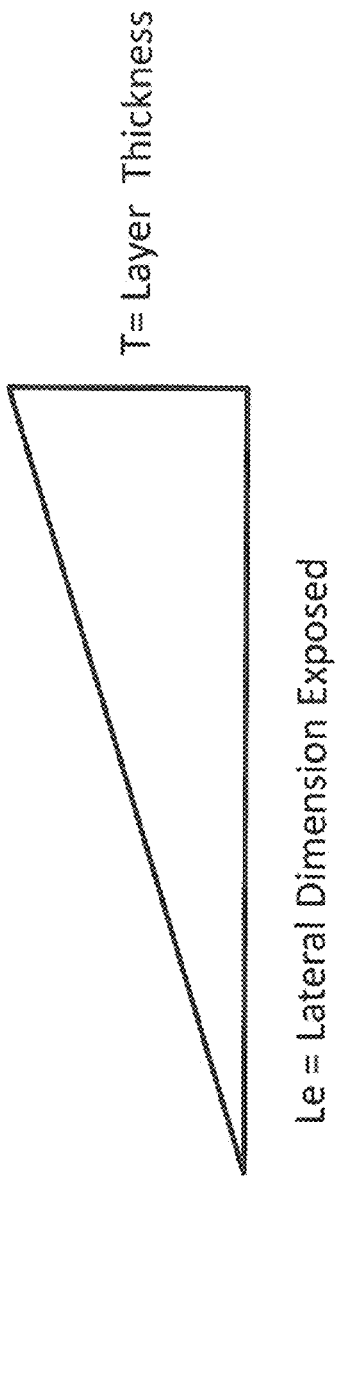
Figure 5 – Example calculations for selectivity ratios or ion mill for photoresist, metal, and dielectrics

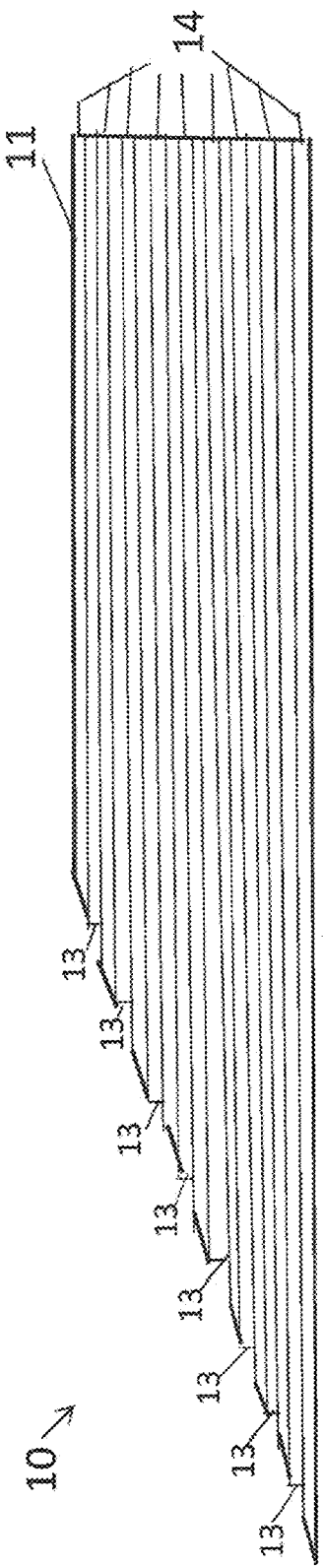
With an HF wet etch of vapor HF
Etching the Oxide or PZT in HF dip or vapor HF would tighten tolerance allow for smaller electroded areas
Metal exposed could be maximized and better handle high oxide/metal and high PZT/metal etch ratios if selectivity is far off
Figure 6 – Selective oxide or PZT etch to clear away the metal

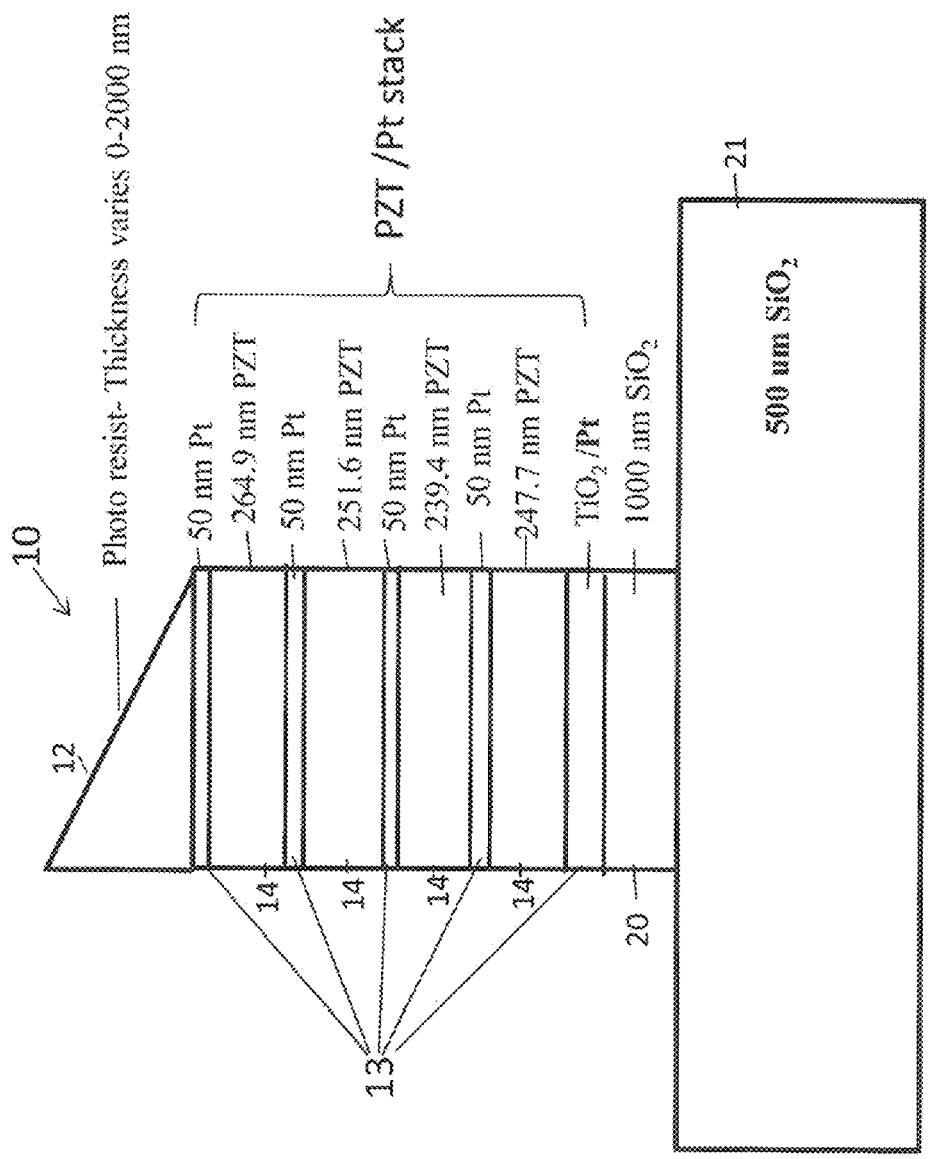
Figure 7 Nominal, exemplary thicknesses for embodiment with PZT/Pt stacks.

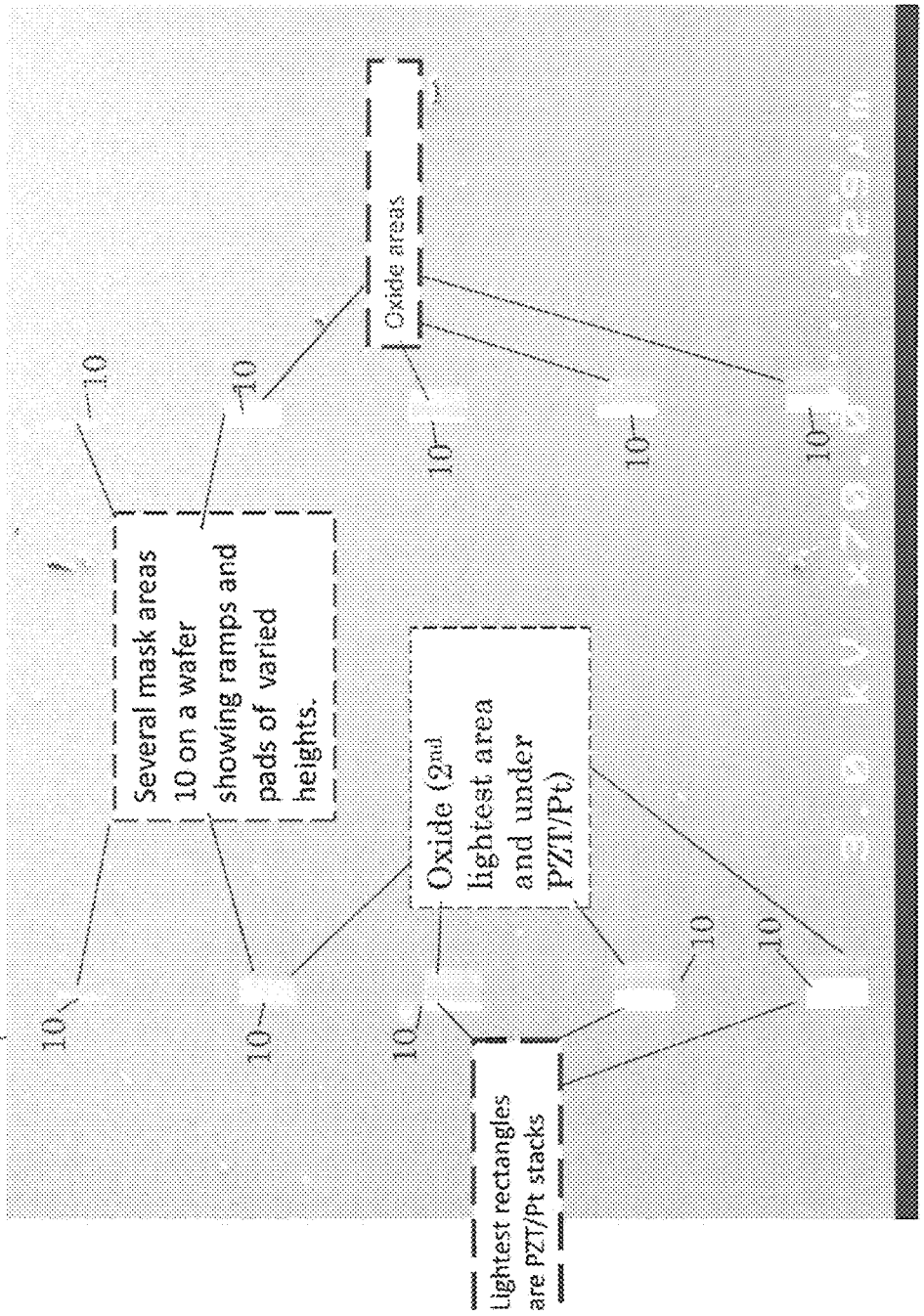
FIG. 8A *Multiple photo thicknesses yield various etch depths into the layers of platinum PZT stacks. PZT wet etches may be used to finish the PZT etch to expose the Pt electrode.

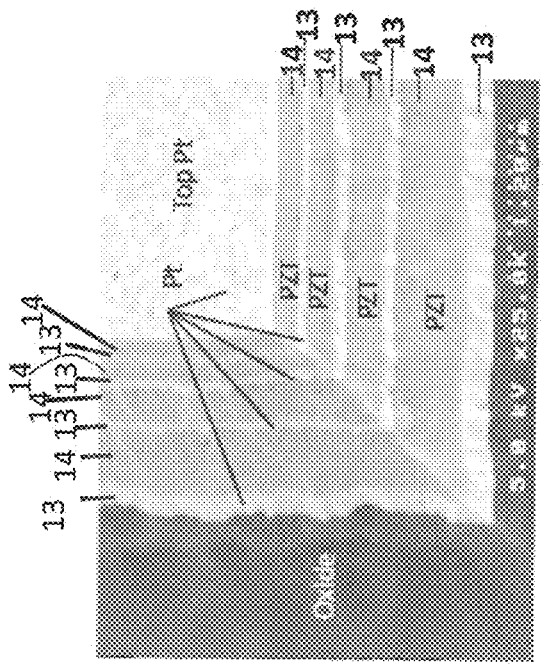
FIG. 9A Etching to Second Dielectric/PZT Layer
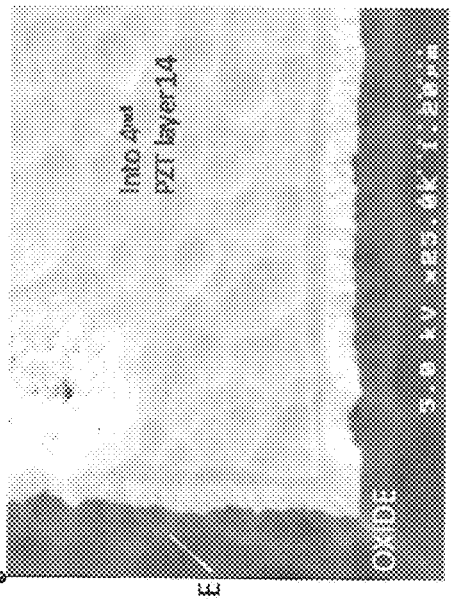
FIG. 9B
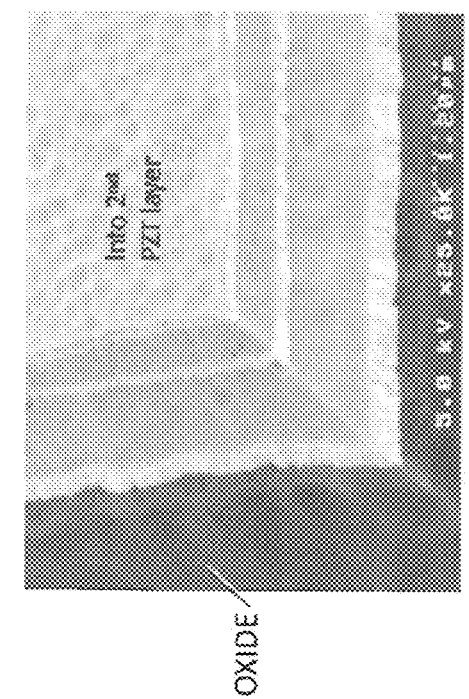
FIG. 9C Etching to Fourth Dielectric/PZT Layer SEM of exposed metal layers in four layer 0.25 μm PZT/Pt stack from a single ion-mill

ELECTRONIC DEVICE STRUCTURE AND METHOD OF MAKING ELECTRONIC DEVICES AND INTEGRATED CIRCUITS USING GRAYSCALE TECHNOLOGY AND MULTILAYER THIN-FILM COMPOSITES

STATEMENT OF GOVERNMENT INTEREST

The invention described herein may be manufactured, used, and licensed by or for the United States Government without the payment of royalties.

BACKGROUND OF THE INVENTION

Gray scale technology for fabrication was also disclosed in U.S. Pat. No. 5,310,623 (Gal '623), "Method for Fabricating Microlenses," issued 10 May 1994, the entirety of which is herein incorporated by reference. In Gal '623, a designed configuration was formed as a replica, which in turn was formed on photoresist material that was used to produce a configuration in a substrate material. The methodology disclosed in Gal '623 involved ultraviolet illumination through a single pixel binary exposure mask, which was subdivided into many subpixels, which in turn was divided into gray scale resolution elements. A replica image was produced by exposing photoresist material to light (through a gray scale model) of a selected wavelength transmitted through openings in the exposure mask for a selected duration of time. The exposed photoresist material was then processed to produce a replica in the photoresist material. As discussed in Gal '623, the process involved removing an amount of unhardened material from a particular subpixel area following light exposure, which produced a replica of the design. The mask opening in each subpixel provided a grey scale resolution depending upon the number of resolution elements incorporated within the mask opening. The gradation of the gray scale resolution ranged from a very light gradation (where the size of the mask opening comprises only a few resolution elements) to a relatively dark gray scale gradation (when the size of the mask opening included the maximum number of gray scale resolution elements for minimum exposure). The replica produced was then used for producing the design in a substrate material by differential ion milling.

Gray scale technology used in conjunction with silicon structures was disclosed in an article by Christopher M Waits, et al., entitled "Investigation of gray-scale technology for large area 3D silicon MEMS structures," J. Micromech. Microeng. 13 170-177 (2003), hereby incorporated by reference. Also disclosed was a discussion of minimum usable pixel size, maximum usable pitch size and the range of usable gray levels for developing 3-D large area silicon structures, together with the resolution of a projection lithography system and the spot size used to write a binary optical mask.

SUMMARY

Etched multilayer thin-film composites suitable for use as electrical connectors, wherein the multilayer thin-film composites comprise alternating dielectric/conductive (i.e., dielectric/metal) layers. Etched multilayer thin-film composites herein comprise at least two conductive layers interleaved between dielectric layers, wherein a multilayer composite comprising alternating dielectric/conductive layers has been etched so as to expose the individual conductive layers therein such that the conductive layers can be individually accessed and connected to, and in electrical contact, with one another. Etched multilayer thin-film composites, methods of making same using grayscale lithography, and methods of using the same are claimed. Applicants are claiming, inter alia, the product made by the methods disclosed.

A preferred method for forming electronic devices on a substrate comprises:
  providing a substrate;
  forming a plurality of layers on the substrate, the layers comprising at least two layers of conducting material and a layer of insulating material there between;
  depositing photoresist material onto predetermined regions of the plurality of layers, the photoresist material varying in thickness;
  utilizing gray scale illumination on the photoresist material;
  removing a portion of the layers using physical etching to expose predetermined portions of the at least two conducting layers.

Optionally, the thickness of the photoresist material may correlate inversely to the portion of the layers removed using physical etching. Ion milling may be used to perform the physical etching. The photoresist material may be used to remove material to provide access to a predetermined layer of conducting material in order to make an electrical connection with the predetermined layer of conducting material. Optionally, the plurality of layers may form discrete electronic devices having varying numbers of layers. The process may be used to form the discrete electronic devices concurrently, such that the gray scale illumination is conducted on a plurality of discrete electronic devices concurrently. Likewise, the physical etching may be conducted on a plurality of discrete electronic devices concurrently; for example, varying thicknesses of material may be removed from different ones of the plurality of discrete electronic devices concurrently. Such discrete electronic devices may be formed, for example, from blocks of material layers with substantially flat surfaces on each side. In order to remove a portion of the layers using physical etching, a triangular portion may be removed from at least one block.

Optionally, the substrate may be fabricated from silicon and the insulating material may be silicon dioxide, titanium dioxide, aluminum oxide, lead zirconate titanate, silicon nitride, barium titanate, barium strontium titanate or mixtures thereof. Optionally, the conducting layers may be any one of platinum, iridium, iridium oxide, ruthenium, ruthenium oxide, gold, silver, aluminum, nickel, copper, and/or mixtures thereof. Conductors may be added to the exposed layers of conducting material which may later be connected in an electrical circuit. The layers may comprise piezoelectric material.

Optionally, the gray scale illumination technique may comprise using pixilated chrome patterns on at least one mask to control the amount of light transmitted, the pixilated mask being projected on the photoresist using a stepper lithography system. Alternately, the gray scale illumination technique may comprise using one of e-beam or laser beam rastering across an appropriately sensitive layer of photoresist material whereby the variable thickness of the photoresist can be controlled via the intensity or time of exposure with the beam on the resist, and wherein the pattern is translated into beam motion via a controller.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 1A is a schematic illustration of a top view of a structure 10 of a preferred embodiment design comprising, for example, a photoresist ramp on a multilayer stack (PZT/Pt or other metal oxide stack).

FIG. 1B is a schematic illustration of a side view of the FIG. 1A structure 10.

FIG. 2A is a schematic illustration of a top view of a stepped structure 10A of a preferred embodiment comprising, for example, a photoresist stepped pattern or region on a multilayer stack (PZT/Pt or other metal oxide stack).

FIG. 2B is a schematic illustrates a side view of the FIG. 2A.

FIG. 3 is a schematic illustration of a structure 10 of a preferred embodiment multilayer thin-film composite embodiment after ion milling; wherein a ramped pattern is transferred into the multilayer stack—etched multilayer thin-film composite. The upper portion of FIG. 3 includes an upper, top view and a lower, side view. Dotted lines are used to correlate the layers of the structure 10 in the top and side views.

FIG. 4 is a schematic illustration of an alternate structure 10 comprising an etched multilayer thin-film composite embodiment further comprising an interdigitated electrode pattern 15, 16.

FIG. 5 provides example calculations for selectivity ratios or ideal iron mill rates for photoresist, metal, and dielectric components.

FIG. 6 is a schematic illustration of an alternate structure 10 in which selective oxide or PZT is etched to clear away the metal—to maximize metal exposure.

FIG. 7 is a schematic illustration of an alternate structure 10 comprising alternate PZT/Pt layers forming a stack on a $SiO_2$ substrate or wafer 21.

FIG. 8A is an illustration of a preferred embodiment etched silicon wafer 21 comprising a plurality of structures 10 forming multilayer thin-film composite/stacks.

FIG. 9A is an illustration revealing an example of etching to a second dielectric or PZT layer.

FIG. 9B is an illustration of a preferred embodiment multilayered structure comprising a top platinum layer and alternating PZT and platinum layers.

FIG. 9C is an illustration revealing an example of etching to a fourth dielectric or PZT layer/

Figure 8B:
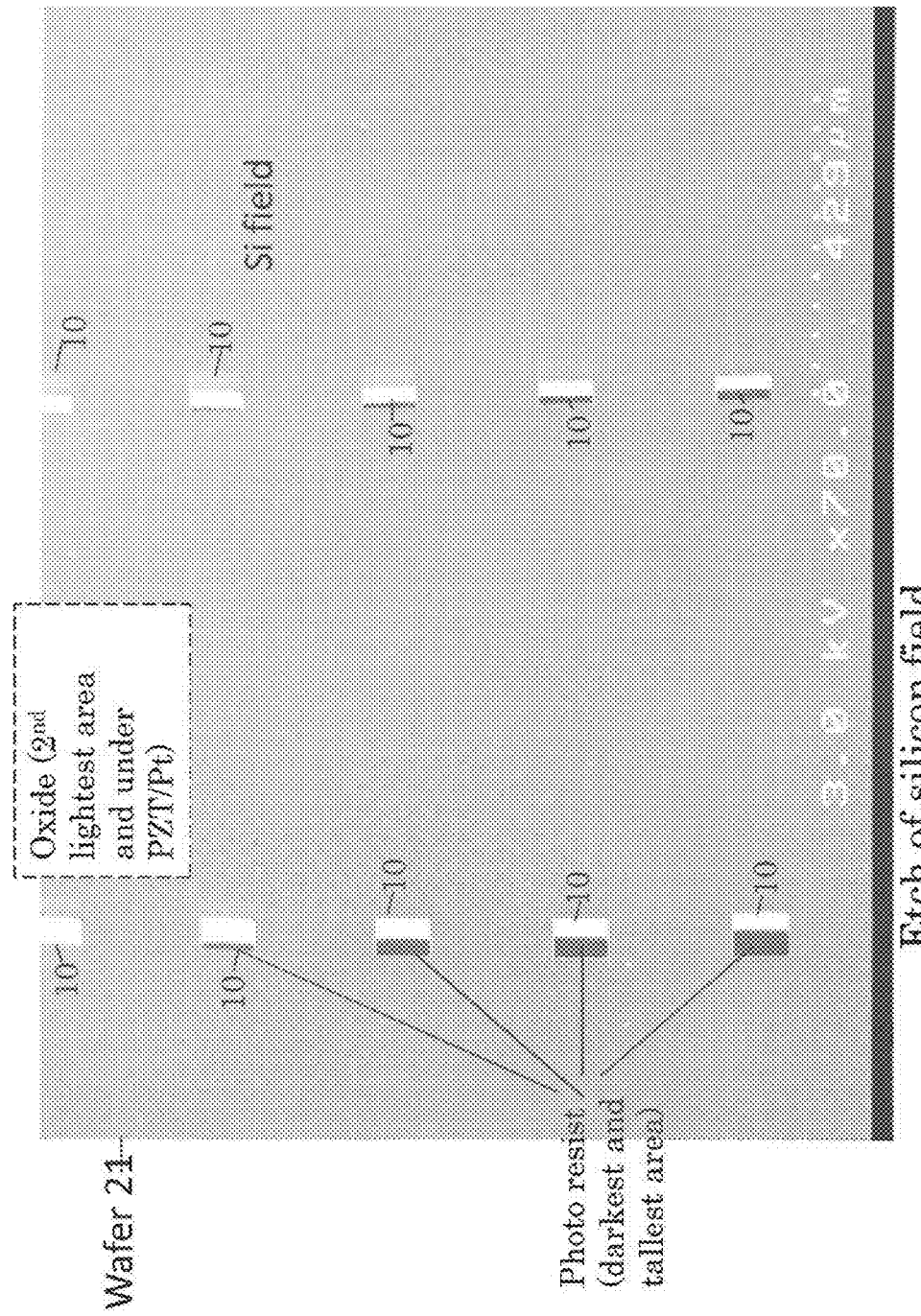
FIG. 8B is an illustration of another preferred embodiment etched silicon wafer 21 comprising a plurality of structures 10 forming multilayer thin-film composite/stacks.

A more complete appreciation of the invention will be readily obtained by reference to the following Description of the Preferred Embodiments and the accompanying drawings. The representations in each of the figures are diagrammatic and no attempt is made to indicate actual scales or precise ratios. Proportional relationships are shown as approximates.

DETAILED DESCRIPTION OF THE INVENTION

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to scope of the present illustrate the precise shape of a region of a device and are not intended to limit the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

By way of introduction, single layer thin film lead zirconate titanate (PZT) microelectromechanical systems (MEMS) have proven to improve the performance of a wide range of MEMS sensors and actuators for robotics, RF devices, and power conversion (see for example Smith, G. L. et al., "PZT-Based Piezoelectric MEMS Technology," Journal of the American Ceramic Society (2012), here by incorporated by reference. Successful microfabrication of multilayer PZT and Pt has led to a requirement to electrically address individual metal layers or connect alternating layers to make bi-directional actuators, sensors and capacitors. The present invention addresses this requirement, and describes a method of employing grayscale lithography for 3-D etching of multilayer thin film composites.

In particular, the present invention relates to multilayer stacks of alternating dielectric and metal materials wherein the multilayer stacks (also referred to herein as "multilayer thin-film composites") are etched using a single mask and ion-mill step so as to provide access to individual layers of metal and dielectric materials therein. This may be accomplished using grayscale lithography to ion-mill multi level steps or low-aspect ratio ramps into a multilayer stack of alternating dielectric/metal materials. Once etched the wafer can optionally be wet etched with a chemically preferential etchant that will clear the dielectric material from the metal regions. This exposes the individual metal layers for subsequent connection with standard, for example, Au trace routing to apply voltage to these layers. The etched multilayer stacks of the present invention are also referred to herein as "etched multilayer thin-film composites."

A preferred embodiment grayscale transfer process uses a High Energy Beam Sensitive (HEBS) glass grayscale test mask (Canyon Material Inc., San Diego, Calif.) [http://www.canyonmaterials.com/prop_hebs1.html in conjunction with both bare silicon wafers and silicon wafers with a four layer stack of PZT and Pt on oxide and Si and silicon dioxide. In both cases the SEM micrographs show clear evidence of pattern transfer of the discrete grayscale steps into the multilayer material. Using the technology of the present invention a .25 um resolution is provided using the HEBS glass.

The PZT/Pt stacks may comprise, for example, a thickness of 4 PZT layers of 0.25 μm thick PZT with 0.1 μm thick Pt. The composite layered stacks range on the order of 0.1-20 μm total thickness.

The etched multilayer thin-film composites of the present invention may be used in devices to provide lower operational voltages, higher capacitances, and bi-directionality. In addition, use of grayscale lithography and ion-milling to etch the multilayer thin-film composites herein provides a cost effective and efficient process of making the same. Since ion-milling is a physical process it extends to all metal/dielectric capacitive stacks.

Etched multilayer thin-film composites and methods of making and using the same are claimed herein.

Unpatterned (unetched) multilayer composite stacks suitable for use in the present invention comprise alternating dielectric and conductive layers deposited or grown on substrate. They can be deposited or grown on substrates like silicon wafers using conventional, well known microfabrication techniques such as, for example purposes only, thermal oxidation, sputtering, sol-gel deposition, evaporation, electroplating, and atomic layer deposition technologies. These techniques are well known to those skilled in the microsystem fabrication art, and commercial systems are available to perform all of these. Suitable conductive layers that may be employed include, for example, gold, copper, aluminum, iridium, iridium oxide, ruthenium, ruthenium oxide, and platinum. Suitable dielectric materials that may be employed include, for example purposes only, silicon dioxide, titanium dioxide, and aluminum oxide. Thin film ferroelectric materials that may be employed herein include Lead Zirconate Titanate (PZT), barium titanate, or barium strontium titanate. In addition, piezoelectric materials can be employed such as aluminum nitride, zinc oxide, or PZT The present invention provides, inter alia, a practical method of accessing and connecting metal layers for the fabrication of multilayer composite devices like metal/dielectric thin-films. A preferred process within the scope of the present invention only requires two masks, regardless of the number of layers. This is unique and improves upon previous methods that require one mask per layer that become time consuming and thus impractical as the layers in the device increase. Furthermore alignment tolerances are additive with each layer, potentially decrease device yield and forcing the design to be larger to compensate for the misalignment. The preferred process can be used to increase, by 1-2 orders of magnitude, the electrode area in the same device die footprint. This will improve capacitance and thus performance of on-chip thin film capacitors and piezoelectric thin-film actuators and sensors, and PZT/Si voltage transformers.

Illustrated in FIGS. 1A and 1B are top and cross sectional views of a preferred embodiment structure 10 comprising a photoresist ramp on a multilayer stack (PZT/Pt or other metal oxide stack). Structure 10 is used herein in the broad sense to relate to a variety of configurations formed on a wafer, integrated circuit chip, or substrate (such as silicon) that may be used to create an electronic device, such as for example, a transformer or the like. Structure 10 may be termed a "pad" with which a device may be formed. As used herein and in the accompanying drawings, structure 10 is used in the generic sense in that various modifications of the structure 10 are shown; all of which are represented generically by the reference number 10. The example of structure 10 shown in FIGS. 1A and 1B comprises a top portion 11 and ramp portion 12. Also shown in FIGS. 1A and 1B are layers 13 and 14, which may be formed, for example, of alternating layers of platinum (13) and PZT (14). However, the present invention is not limited to utilizing stacks of PZT and platinum. Unpatterned (unetched) multilayer composite stacks suitable for use in the present invention comprise alternating dielectric and conductive layers deposited or grown on substrate. The layers 13, 14 may be deposited or grown on substrates like silicon wafers using conventional, well known microfabrication techniques such as, for example, thermal oxidation, sputtering, sol-gel deposition, evaporation, electroplating, and atomic layer deposition technologies. Such techniques are well known to those skilled in the microsystem fabrication art, and commercial systems are available to perform all of such depositions. Suitable conductive layers that may be employed include, for example, gold, copper, aluminum, iridium, iridium oxide, ruthenium, ruthenium oxide, and platinum. Suitable dielectric materials that may be employed include, for example purposes only, silicon dioxide, titanium dioxide, and aluminum oxide. Thin film ferroelectric materials that may be employed herein include Lead Zirconate Titanate (PZT), barium titanate, or barium strontium titanate. In addition, piezoelectric materials can be employed such as aluminum nitride, zinc oxide, or PZT A preferred process comprises making a ramped (FIG. 1A, 1B) or stepped (FIG. 2A, 2B) pattern in photoresist on a multilayer metal/dielectric composite stack. Next, the ramp or stepped profile is etched using a physical plasma based etch with close selectivity of the photoresist and material being etched. This process allows access to predetermined metal and/or dielectric layers. Techniques to achieve a ramped (FIG. 1A) or stepped pattern (FIG. 2A) in photoresist include gray-scale photolithography using sub-resolution binary optical masks, High Energy Beam Sensitive Glass (HEBS), laser or e-beam direct write of photoresist or the like. Techniques to transfer the ramped or stepped pattern into the multilayer stack include ion mill (optimal for 1:1 transfer—physical ion etch, Ar ion bombardment), or reactive ion etch. The materials forming the layers 13, 14 comprise but are not limited to Pt, Al, Au, Cu, $SiO_2$, Lead Zirconate Titanate and Pt. Techniques to deposit the materials and/or metals include, but are not limited to, deposition in an atomic layer deposition tool, sputtering, evaporation, and plating. PZT/Pt stacks have been demonstrated to a typical pattern thickness of 4 PZT layers of 0.25 µm PZT with 0.1 µm thick Pt. Though etching via ion mill could be performed with multimaterial composite layered stacks ranging on the order of 0.1-20 µm total.

Shown in FIGS. 2A, 2B is an alternate structure 10A after the gray scale photoresist pattern is deposited. Specifically, the structure 10A comprises a stepped portion 22 and a plateau portion 21 positioned above a stack of alternating layers 13 and 14. The stack illustrated in FIGS. 2A and 2B is a PZT/platinum stack, but other metal oxide stacks may be used without departing from the spirit of the invention.

Using a grayscale pattern etched into the underlying layers, a ramped profile is exposed. Referring now to FIG. 3, following removal of the photoresist material present in FIGS. 1A, 1B, 2A and 2B, the structure after ion milling comprises a plateau portion 11 and ramped portion 12 (shown to the left). The ion milling is utilized to shape the structure 10 by firing ions (typically argon) at the surface from an angle and sputtering material from the surface of the structure 10. It is noted that the process utilized in the article by Christopher M Waits, et al., entitled "Investigation of gray-scale technology for large area 3D silicon MEMS structures," J. Micromech. Microeng. 13 170-177 (2003) used gray scale to shape photoresist and then transfer the shape into silicon via a Deep Reactive Ion Etch (DRIE) tool. This is a single material in a silicon etching tool. A preferred methodology incorporating the concepts of the present invention utilizes a similar gray scale process with multilevel features. One difference vis-a-vis multilayer stacks of materials (i.e., metals and dielectrics) regarding an Ion Mill etching tool is that a physical etch is utilized as opposed to a chemical/physical etch like DRIE. Ion milling also results in a more predictable, closer to 1:1 etch ratio between the multilayer material stack and the photo-resist, thus the gray scale optical mask must be designed accordingly. The multilayer materials can be used to make useful electrical components like smaller footprint thin-film capacitors, and lower voltage PZT actuators, and higher step-ups in PZT transformers.

Referring again to FIG. 3, note that the topography of the photoresist portion is essentially transferred into the stacked layer portion (i.e., configuration of layers 13, 14) following ion milling. In the case illustrated in FIG. 3, only the ramped configuration is shown; however, one of ordinary skill in the art would appreciate that the stepped configuration could be utilized in which case the left-most portion of FIG. 3 would appear as a stepped configuration instead of the ramp configuration illustrated. By utilizing this photoresist technique, a significant cost and time savings is achieved due to the somewhat universality of the photoresist transfer process.

One goal of gray scale lithography is to pattern the photoresist such that the patterned photoresist layer is comprised of areas containing variable thickness profiles. There are several knows techniques in the prior art to achieve this. One preferred method is High energy beam sensitive (HEBS) glass that uses the beam induced reduction of silver ions in a silver-alkali-halide material to produce the darkening of glass with silver atoms. The darkened silver atoms modulate the opacity of the photomask. 0.25 µm feature resolution is possible on the HEBS glass. A second method used in the MEMS community is a process to pixilate binary patterns on masks to control the amount of light transmitted. This pixilated mask is projected onto photoresist using a projection lithography system. A third method that can achieve gray scale lithography involves the use of a scanning direct write systems with either e-beam or laser beam rastering across an appropriately sensitive layer of photoresist. The variable thickness of the photoresist can be controlled via the intensity or time of exposure with the beam on the resist. The pattern is translated into beam motion via a controller. Heidelberg® is an example of a commercial company that produces laser direct write systems with gray-scale lithography capability. In accordance with the principles of the present invention, layer thickness of the photoresist may be controlled to within 100 nm step height with the laser direct write Heidelberg® system.

The present invention incorporates an extension of the gray scale process and a technique to fabricate specific type of devices with gray scale on multilayer composites. The concepts of the present invention may be utilized with two gray scale techniques. HEBS glass masks with gray features and direct write with laser-exposed photoresist.

It can be appreciated by those of ordinary skill in the art that a grayscale pattern can be etched in to the underlying layers to expose the ramped profile (as seen in the top portion of FIG. 3) and this process effectively lengthens exposed sections of metal for connection in an electrical circuit. Referring now to FIG. 4, shown is a multilayer stack with interdigitated electrode pattern. This allows for alternating layers to be connected which is a common need in many capacitive devices. Specifically, the interdigitated electrode pattern is formed by transverse portions 17 and 18 and interconnecting portions 15 and 16 of a metallic layer such as, for example, gold. Specifically, following the creation of the ramp and exposure of the layers 14, the interconnecting portions 15, 16 are formed on alternating layers 14 as shown in the lower portion of FIG. 4. Although gold is used in conjunction with the transverse and inter connecting portions 15 through 18, one of ordinary skill in the art would appreciate that a variety of metallic materials may be utilized; including silver, nickel, copper, platinum or the like.

FIG. 5 is an overview of calculations used for selectivity ratios for photoresist. The calculation shown are based on the ratio of the lateral dimension exposed (denoted as Le) and the layer thickness (T). In essence, FIG. 5 shows how the final dimensions are affected by etch selectivity and layer thicknesses. If the ratio of T/Le is equal to $\frac{1}{10}$, for a thickness of 0.5 µm, approximately 5 µm per layer is needed. If the ratio of T/Le is equal to $\frac{1}{50}$, for a thickness of 0.2 µm, approximately 10 µm per layer is needed. Ideally, ion mill rates are close to the following ratio:

$$R_{PR}/T_{PR}=R_{PZT}\Sigma T_P/PZT$$

As illustrated in FIG. 6, a selective oxide or PZT etch may be utilized to expose a larger area of the preferred contact than that of, for example, FIG. 3. For instance, for a Pt/PZT multilayer stack, with a ramp etch as illustrated in FIG. 3, could be exposed to an HF solution that would remove the exposed PZT and uncover more of the Pt top surface. This would open the tolerance for the next Au layers to contact the Pt. This concept would work for many other multimaterial stacks.

FIG. 7 is a schematic illustration of an alternate structure 10 comprising alternate PZT/Pt layers forming a stack on a SiO$_2$ substrate or wafer 21. Wafer 21 may be formed of SiO$_2$ which in the example given is 500 µm. Formed on wafer or substrate 21 is a base layer of SiO$_2$ which may be, for example, approximately 1000 nm thick. The base layer 20 is forms the beginning of the structure 10 which is representative of a structure that may comprise a variety of layers of various materials which may be used to construct an electronic device (such as for example a transformer) on the wafer, chip or substrate 21. Such areas are known as "pads" to those skilled in the art. Constructed on the base layer 20 is a layer of TiO$_2$ or platinum. Alternating layers of PZT and platinum may be formed as illustrated in FIG. 7. However, the invention is not limited to PZT and platinum as a variety of metal oxides or dielectric may be substituted for the PZT layers shown and a variety of metals, such as nickel, aluminum, copper, gold, silver and/or combinations thereof may be substituted for the platinum layers shown in FIG. 7. The ramp 12 is formed in the photoresist material shown in a triangular cross section at the top of FIG. 7. Directly underneath in the example shown in FIG. 7 is a 50 nm thick platinum layer 13. Underneath is a 264.9 nm thick PZT layer. These layers as well as the layers beneath will be subjected to the gray scale technique in accordance with the principles of the present invention as described herein. Specifically, the ramped profile of the photoresist material will be transferred to the layers underneath the photoresist material as shown in FIG. 3, thereby exposing certain of the layers 13, 14 as described above.

Although the preferred methodology has been described in relation to structures 10 and 10A, numerous such structures 10, 10A may be situated on a wafer 21 as shown in FIG. 8A. FIG. 8A is an illustration of a preferred embodiment etched silicon wafer 21 comprising a plurality of structures 10 forming multilayer thin-film composite/stacks. It can be appreciated by those skilled in the art that an electronic circuit (or "chip") comprising numerous electronic devices may be formed concurrently using individual stacks 10 to form different electronic devices, such as for example, a transformer. By etching through the stack in the manner described above, electrical contact may be made with a preselected layer. Illustrated in FIG. 8A are PZT/Pt stacks (shown as the lightest rectangles), oxide layers (second lightest areas) and several mask areas on the wafer 21 showing ramps and pads of varied heights. Various heights may be used to construct transformers of varying output power. A transformer with more layers translates into increased power output. Multiple photo thicknesses yield various etch depths into the layers of the platinum PZT stacks. PZT wet etches used to finish the PZT etch operate to expose the electrode or layer of platinum.

FIG. 8B is an illustration of another preferred embodiment etched silicon wafer 21 comprising a plurality of structures 10 forming multilayer thin-film composite/stacks 10. The photoresist areas are shown by the darkest (and tallest) areas. The oxide layers are the second lightest areas.

Figure 8C:
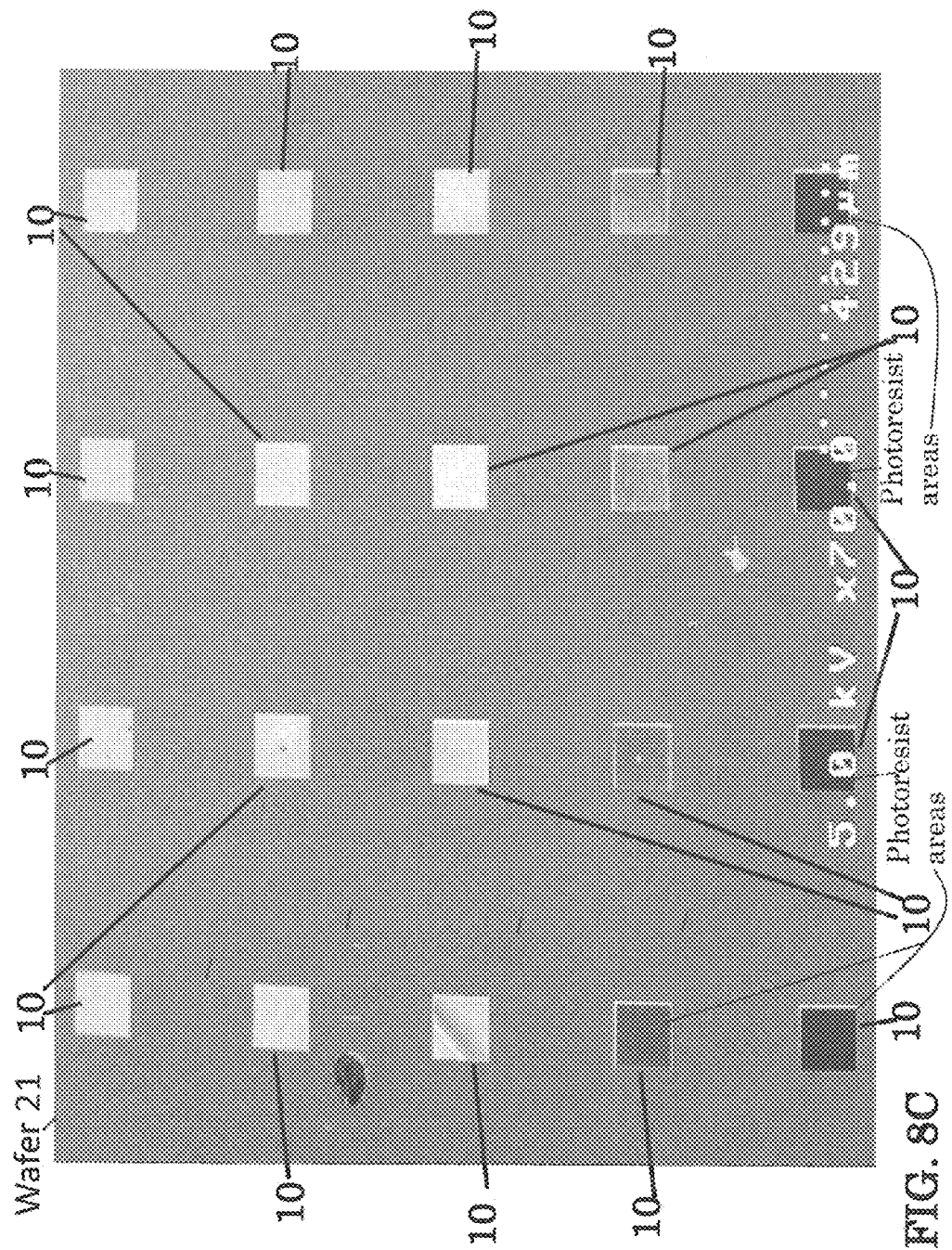
FIG. 8C is an illustration of another preferred embodiment etched silicon wafer 21 comprising a plurality of structures 10 forming multilayer thin-film composite/stacks, wherein the photoresist correlates to the darkest areas.

FIG. 8C is an illustration of another preferred embodiment etched silicon wafer 21 comprising a plurality of structures 10 forming multilayer thin-film composite/stacks, wherein the photoresist correlates to the darkest areas.

Figure 8D:
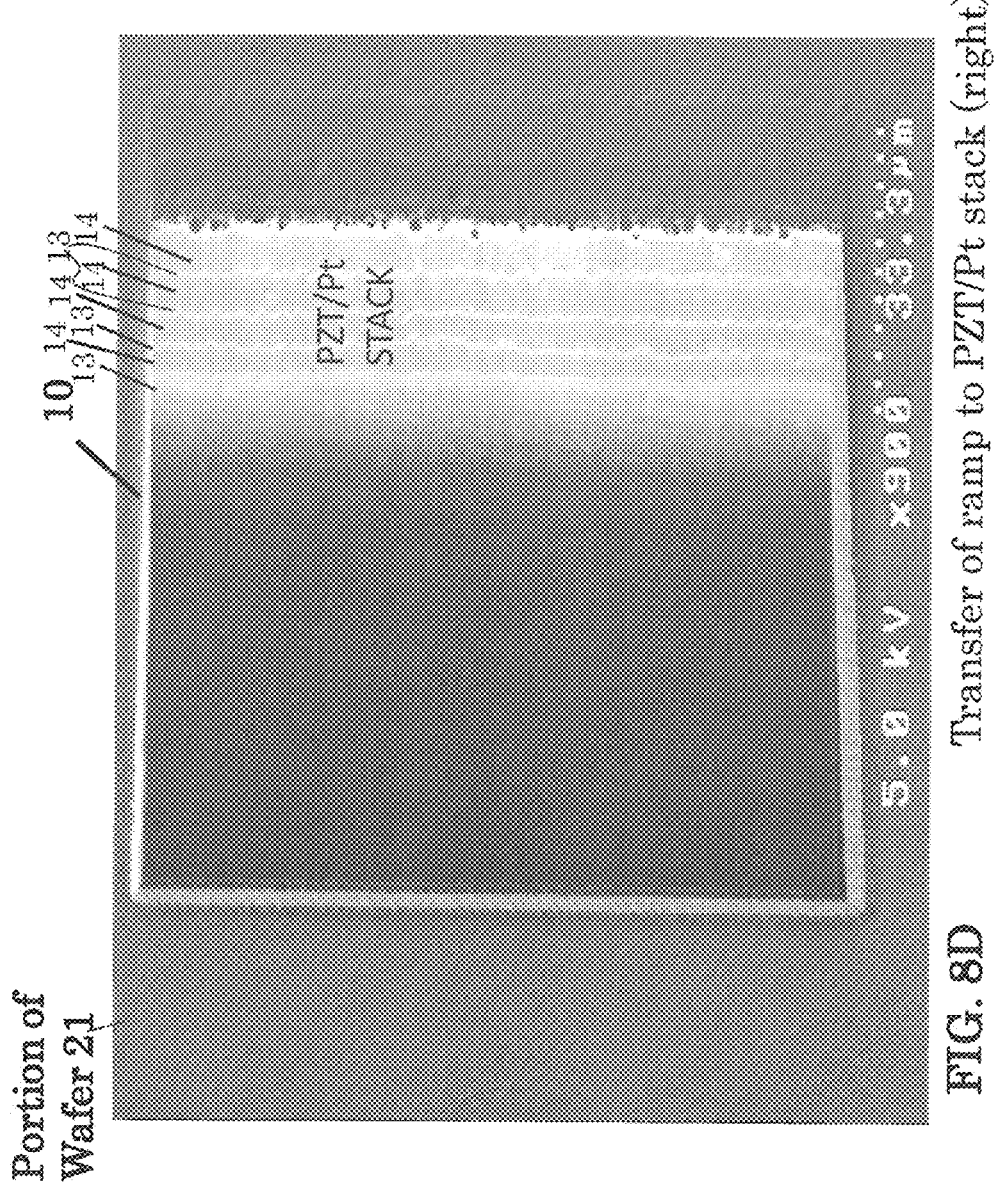
FIG. 8D is a closed-up view showing an illustration of another preferred embodiment etched silicon wafer portion comprising a structure 10 comprising a multilayer thin-film composite/stack.

FIG. 8D is a closed-up view showing an illustration of another preferred embodiment etched silicon wafer portion comprising a structure 10 comprising a multilayer thin-film composite/stack; including a ramped area exposing layers 13, 14 in the lightened area to the right in FIG. 8D.

FIG. 9A is an illustration revealing an example of etching to a second dielectric or PZT layer. Shown therein is a ramp profile etched into the PZT multilayer stack (progressive magnification of the samd device is illustrated). Note transfer of the pattern in the SiO$_2$ and Si as well. FIG. 9B is an illustration of a preferred embodiment multilayered structure comprising a top platinum layer and alternating PZT and platinum layers. FIG. 9C is an illustration revealing an example of etching to a fourth dielectric or PZT layer.

Figures 10A, 10B:
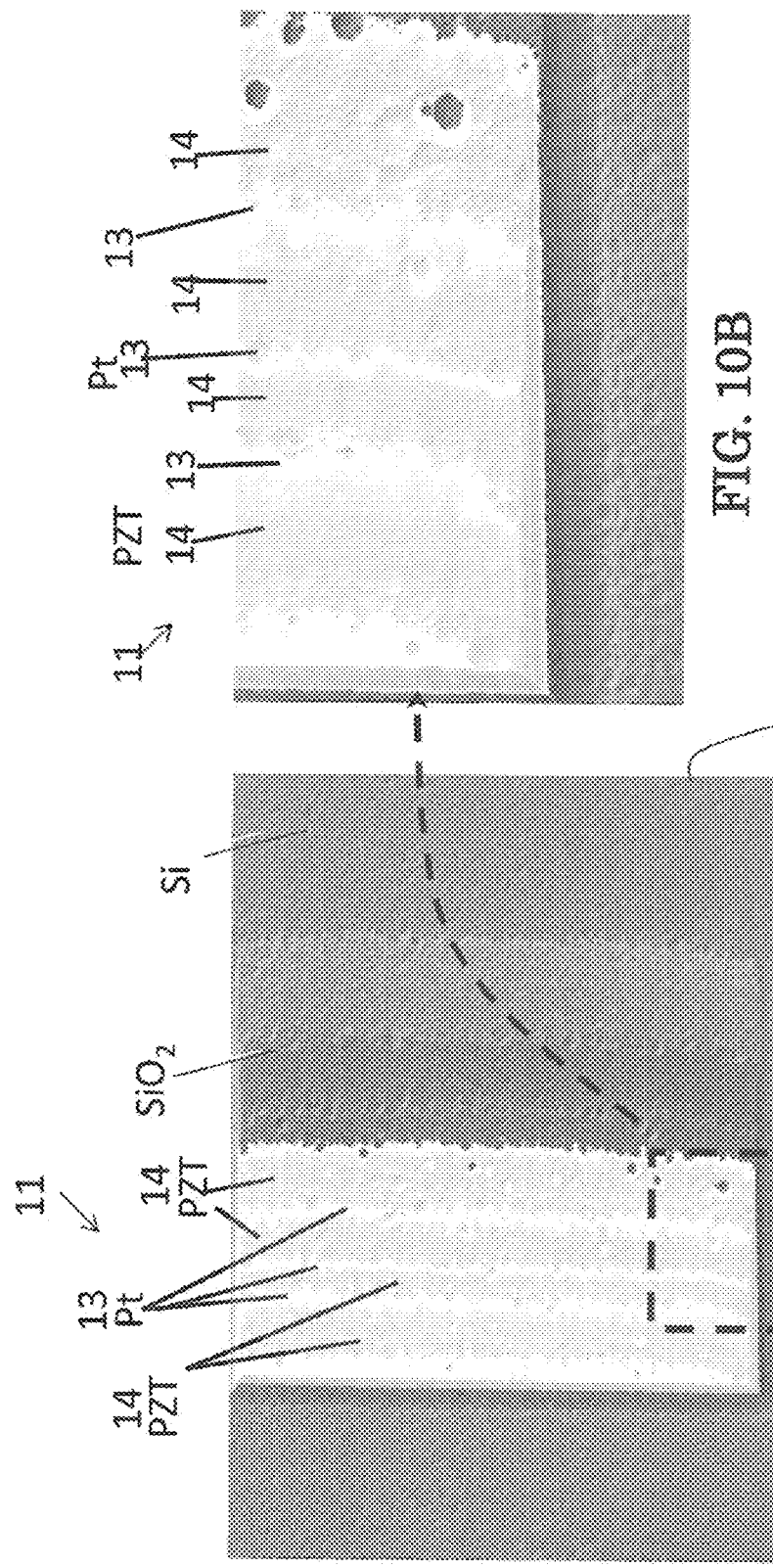
FIG. 10A is an illustration of a portion of a wafer 21 showing a partial view of a stacked structure comprising a ramped portion 11.
FIG. 10B is an enlarged view of a portion of FIG. 10A.

FIG. 10A is an illustration of a portion of a wafer 21 showing a partial view of a stacked structure comprising a ramped portion 11. FIG. 10B is an enlarged view of a portion of FIG. 10A.

The present invention provides a practical method of accessing and connecting metal layers for the fabrication of multilayer composite devices like conductive/dielectric thin films. A preferred method entails a novel application of "grayscale lithography." The process only requires two masks, regardless of the number of layers. This is unique and improves upon previous methods that require one mask per layer that become time consuming and thus impractical as the layers in the device increase. The process can be used to increase, by 1-2 orders of magnitude, the electrode area in the same device die footprint. This will improve capacitance and thus performance of on-chip thin film capacitors and piezoelectric thin-film actuators and sensors. The preferred process can also be tailored to access buried electrodes in arbitrary depths in wideband width solar cell composites stack. The ion milling process is relatively insensitive to materials chosen and is thus applicable to a wide range of material combinations. In addition to improving device performance, the invention has the potential to increase the practicality of making multi layer devices and provide increase cost effectiveness for previous concepts that could not have been made manufacturable.

The method of making an electrical multilayered structure within the scope of the present invention (etched multilayer thin-film composite suitable for use as electrical connectors) reduces the time, cost and footprint required to access multiple buried electrodes. It further provides for the use of fewer masks for fabricating PZT/Si voltage transformers. The process may be used to simplify the fabrication of and improve the capacitance of devices that incorporate multi-layer thin films—i.e., multilayer thin-film capacitors and piezo-electric actuators and sensors. It allows multiple layers to be exposed in a single photoresist and single gray scale mask.

The concepts of the present invention and preferred embodiments disclosed herein within the scope of the present invention may be used to (1) increase capacitance on thin film capacitors enabling more compact designs; (2) increase capacitance and thus actuator performance for a given voltage in piezoelectric devices; and (3) apply individual voltages to any layer in multilayer piezoelectric devices improving control of motion, which could create bipolar actuators in MEMS. Uses of the invention are not intended to be limited to those identified, as one having ordinary skill in the art will recognize that the electrical connectors herein may be used for other purposes as well.

Key advantages of the present invention include: (1) simplified and more practical fabrication process—process only requires one mask and one ion mill step and one mask and metal deposition pattern to make contact regardless of the number of layers; (2) improved exposure of electrode area by 1-2 orders of magnitude in the same device die footprint. This also improves the work and force density in actuators and the capacitance/unit area in capacitors by 1-2 orders of magnitude; (3) improved voltage performance. This results in increased performance at the same voltage or lowering the voltage for the same respective performance applications (i.e., on-chip thin film capacitors and piezoelectric thin-film actuators and sensors); (4) improved alignment tolerances as the invention helps to alleviate tolerance issues that are additive with each layer using traditional grayscale lithography techniques (i.e., each mask needs to be properly aligned with the previous mask in order to achieve the desired 3-D etching result or reveal with prior art technique.)

As used herein the terminology "gray scale," "grayscale" or "grayscale" relates to a technique involving the projection or transfer of intensity information comprising shades of gray, varying in the range between black and white, which may or may not include black and/or white. The concepts of the present invention may be utilized with two gray scale techniques; i.e., HEBS glass masks with gray features and direct write with laser-exposed photoresist (specializes in the fabrication of true gray-level masks). High Energy Beam Sensitive (HEBS) glass relates to gray-level (gray-scale) mask using a standard e-beam pattern generator. HEBS-glass turns dark instantaneously upon exposure to an electron beam; the more electron dosage (current×dwell time), the darker the glass gets. According to the Canyon Materials, Inc website http://www.canyonmaterials.com/hebsglass.html, HEBS-glass is capable of resolution to molecular dimensions and an electron beam can be focused to a 0.1 μm spot size within a 5"×5" plate of HEBS-glass, whereupon a transmittance value required by a mask user results in a capability of more than 500 gray levels, with the minimum width of a gray level being 0.1 μm.

As used herein, the terminology "photoresist" means a light-sensitive material used to form a patterned coating on a surface and/or in material(s) (including a stack of materials). Photoresists include positive resists in which the portion of the photoresist that is exposed to light becomes soluble to the photoresist developer and the unexposed portion remains insoluble to the photoresist developer and a negative resist in which the portion exposed to light becomes insoluble to the photoresist developer and the unexposed portion of the photoresist is dissolved by the photoresist developer.

As used herein the terminology "concurrently" means at or about the same time. The terminology concurrently includes but is not limited to overlapping in duration.

As used herein the terminology physical etching means process of etching through physical interactions (momentum transfer) between accelerated chemically inert ions (e.g. argon) and the material to be etched.

Obviously, many modifications and variations of the present invention are possible in light of the above teachings. It is therefore to be understood that, within the scope of the appended claims, the invention many be practiced otherwise than as specifically described.

The invention claimed is:

1. A method for forming at least one electronic device on a substrate comprising:

providing a substrate;

forming a plurality of layers on the substrate, the layers comprising at least two layers of conducting material and a layer of insulating material therebetween;

depositing photoresist material onto predetermined regions of the plurality of layers, the photoresist material varying in thickness and the thickness of the photoresist material correlates inversely to the portion of the layers removed using physical etching;

utilizing gray scale illumination on the photoresist material;

removing a portion of the plurality of layers using physical etching to expose predetermined portions of the at least two conducting layers, and wherein the physical etching comprises ion milling.

2. The method of claim 1 wherein the thickness of the photoresist material is used to remove material to provide access to a predetermined layer of conducting material in order to make an electrical connection with the predetermined layer of conducting material.

3. The method of claim 1 wherein the plurality of layers are formed into a plurality of discrete electronic devices, the electronic devices having a varying number of layers; and wherein the photoresist is used to provide access to at least one layer of conducting material located with at least one of the discrete electronic devices, and wherein the layer of insulating material comprises a piezoelectric material.

4. The method of claim 3 wherein the photoresist is utilized on a plurality of discrete electronic devices concurrently, such that the gray scale illumination is conducted on a plurality of discrete electronic devices concurrently, and the physical etching is conducted on a plurality of discrete electronic devices concurrently, such that varying thicknesses of material are removed from different ones of the plurality of discrete electronic devices concurrently.

5. The method of claim 3 wherein the plurality of discrete electronic devices are formed of blocks of material layers with substantially flat surfaces on each side.

6. A product made by the method of claim 3.

7. The method of claim 1 wherein the substrate is silicon and further comprising the step of mounting first and second conductors to the at least two layers of conducting material, the first and second conductors adapted to be connected in an electrical circuit.

8. The method of claim 1 wherein the utilizing of gray scale illumination on the photoresist material comprises using a High Energy Beam Sensitive glass mask.

9. The method of claim 1 wherein the insulating material is silicon dioxide, titanium dioxide, aluminum oxide, lead zirconate titanate, silicon nitride, barium titanate, or barium strontium titanate.

10. The method of claim 1 wherein the conducting layers are any one of platinum, iridium, iridium oxide, ruthenium, ruthenium oxide, gold, silver, aluminum, nickel or copper.

11. The method of claim 1 wherein the step of removing a portion of the layers using physical etching comprises selectively exposing the at least two layers of conducting material by removing portions of the layers above a lowermost layer of conducting material.

12. The method of claim 1 wherein the plurality of layers comprise at least one layer of piezoelectric material.

13. The method of claim 1 wherein the plurality of layers comprises at least one layer of ferrorelectric material.

14. A product made by the method of claim 1.

15. The method of claim 1 wherein the depositing photoresist material onto predetermined regions of the plurality of layers comprises patterning the photoresist layer into areas containing variable thickness profiles and wherein the utilizing of gray scale illumination on the photoresist material comprises using High energy beam sensitive (HEBS) glass using beam induced reduction of silver ions in a silver-alkali-halide material to produce the darkening of glass with silver atoms, whereby the darkened silver atoms modulate the opacity of the photomask.

16. The method of claim 1 wherein the utilizing of gray scale illumination comprises using one of e-beam or laser beam rastering across an appropriately sensitive layer of the photoresist material whereby the variable thickness of the photoresist can be controlled via an intensity or time of exposure with the beam on the photoresist material, and wherein a pattern is translated into beam motion via a controller.

17. A method for forming electronic devices on a substrate comprising:
  providing a substrate;
  forming a plurality of layers on the substrate into a plurality of discrete electronic devices, the plurality of discrete electronic devices being formed of blocks of material layers with substantially flat surfaces on each side, the electronic devices having a varying number of layers, the layers comprising at least two layers of conducting material and a layer of insulating material therebetween;
  depositing photoresist material onto predetermined regions of the plurality of layers, the photoresist material varying in thickness, the photoresist being used to provide access to at least one layer of conducting material located with at least one of the discrete electronic devices;
  utilizing gray scale illumination on the photoresist material;
  removing a portion of the plurality of layers using physical etching to expose predetermined portions of the at least two conducting layers, the physical etching comprising etching away an angular portion of at least one block.

18. A method for forming at least one electronic device on a substrate comprising:
  providing a substrate;
  forming a plurality of layers on the substrate, the layers comprising at least two layers of conducting material and a layer of insulating material therebetween;
  depositing photoresist material onto predetermined regions of the plurality of layers, the photoresist material varying in thickness and having a profile that is ramped shaped in cross section taken perpendicular to the plane of the substrate;
  utilizing gray scale illumination on the photoresist material;
  removing a portion of the plurality of layers using physical etching to expose predetermined portions of the at least two conducting layers.

* * * * *